United States Patent
Wang et al.

(10) Patent No.: US 11,621,681 B2
(45) Date of Patent: Apr. 4, 2023

(54) RADIO FREQUENCY POWER AMPLIFIER AND DEVICE

(71) Applicant: Telefonaktiebolaget LM Ericsson (publ), Stockholm (SE)

(72) Inventors: Zhancang Wang, Beijing (CN); Shun Li, Beijing (CN)

(73) Assignee: Telefonaktiebolaget LM Ericsson, Stockholm (SE)

( * ) Notice: Subject to any disclaimer, the term of this patent is extended or adjusted under 35 U.S.C. 154(b) by 295 days.

(21) Appl. No.: 17/045,832

(22) PCT Filed: Apr. 27, 2018

(86) PCT No.: PCT/CN2018/084784
§ 371 (c)(1),
(2) Date: Oct. 7, 2020

(87) PCT Pub. No.: WO2019/205084
PCT Pub. Date: Oct. 31, 2019

(65) Prior Publication Data
US 2021/0143782 A1 May 13, 2021

(51) Int. Cl.
*H03F 3/24* (2006.01)
*H03F 1/56* (2006.01)
(Continued)

(52) U.S. Cl.
CPC .............. *H03F 3/245* (2013.01); *H03F 1/56* (2013.01); *H03F 3/19* (2013.01); *H03F 3/60* (2013.01);
(Continued)

(58) Field of Classification Search
CPC ... H03F 3/245; H03F 1/56; H03F 3/19; H03F 3/60; H03F 2200/318; H03F 2200/451; H03F 2200/543
(Continued)

(56) References Cited

U.S. PATENT DOCUMENTS

| 4,518,931 A | 5/1985 | Rauscher |
| 7,176,769 B1 | 2/2007 | Ellis |

(Continued)

FOREIGN PATENT DOCUMENTS

| CN | 101038979 A | 9/2007 |
| CN | 104143674 A | 11/2014 |

(Continued)

OTHER PUBLICATIONS

Li et al., "Application of Load-pull in Power Amplifier Design", published in Chemical Engineering Transactions, vol. 51, 2016 (Year: 2016).*

(Continued)

*Primary Examiner* — Hafizur Rahman
(74) *Attorney, Agent, or Firm* — Sage Patent Group

(57) ABSTRACT

A radio frequency power amplifier and a device are disclosed. A first microstrip line and a second microstrip line are coupled, one end of the second microstrip line is an open stub and another end of the second microstrip line is grounded; and the first microstrip line having a first width is connected to a first transmission line having a second width which is wider than the first width. Therefore, some harmonic bands suppression can be implemented independently. Furthermore, the harmonic termination is independent and may not impact one or more fundamental components during matching a network. In addition, it may not take up more space and is sufficiently compact. Furthermore, sufficient wide harmonic response bandwidth can be provided.

14 Claims, 14 Drawing Sheets

(51) Int. Cl.
*H03F 3/19* (2006.01)
*H03F 3/60* (2006.01)

(52) U.S. Cl.
CPC .. *H03F 2200/318* (2013.01); *H03F 2200/451* (2013.01); *H03F 2200/543* (2013.01)

(58) Field of Classification Search
USPC .......................................................... 330/302
See application file for complete search history.

(56) References Cited

U.S. PATENT DOCUMENTS

2008/0191801 A1  8/2008  Kim et al.
2013/0335147 A1* 12/2013  Ma ........................... H03F 1/32
                                                    330/296

FOREIGN PATENT DOCUMENTS

| CN | 104900949 A | 9/2015 |
| CN | 105304984 A | 2/2016 |
| CN | 105977585 A | 9/2016 |
| CN | 105977598 A | 9/2016 |
| WO | 2010134858 A1 | 11/2010 |

OTHER PUBLICATIONS

International Search Report and Written Opinion for International Patent Application No. PCT/CN2018/084784, dated Jan. 30, 2019, 7 pages.

Chaimool, Sarawuth, et al., "Resonator-Embedded Four-Pole Cross-Coupled Dual-Band Microstrip Bandpass Filters," International Symposium on Communications and Information Technologies, 2006, IEEE, pp. 1076-1079.

Chio, Chi-Hou, et al., "Compact Quasi-Elliptic Bandpass Filter with a Very Wide Stopband Using Quarter-Wavelength Stepped-Empedance Resonators," Proceedings of APMC, Dec. 2012, Kaohsiung, Taiwan, pp. 535-537.

Pal, Manimala, et al., "A Distinctive Resonance," IEEE Microwave Magazine, Dec. 2015, pp. 36-55.

Extended European Search Report for European Patent Application No. 18916937.8, dated Nov. 25, 2021, 9 pages.

* cited by examiner

RADIO FREQUENCY POWER AMPLIFIER AND DEVICE

This application is a 35 U.S.C. § 371 national phase filing of International Application No. PCT/CN2018/084784, filed Apr. 27, 2018, the disclosure of which is incorporated herein by reference in its entirety.

TECHNICAL FIELD

Embodiments of the present disclosure generally relate to the field of electronic components of telecommunications, and more particularly, to a radio frequency power amplifier and a device.

BACKGROUND

A radio frequency (RF) power amplifier (PA), such as Doherty PA, may be a mainstream solution for an infrastructure of a radio transmitter. Conventional Doherty PA structures include at least one of the following sub amplifier cells: class-AB, class-B and class-C. However, amplifier cells with harmonic control may be employed as a straightforward method to increase total efficiency with compound semiconductor power transistors. With the development of modern digital pre-distortion (DPD) schemes, it is possible to use nonlinear amplifier cells for Doherty PA to trade off efficiency to linearity. For example, classes -E, -F, and $-F^{-1}$ mode amplifiers are commonly deployed.

In a Doherty PA, for example, a harmonic control circuit (HCC) may be implemented on a separate printed circuit board (PCB) which is configured outside of an active device package or an active device bare-die. Another way of HCC implementation is on-chip, either with bond wires connecting capacitors or integrated passive devices (IPDs), or monolithically integrated on monolithic microwave integrated circuits (MMICs). The active devices may be either on the same semiconductor substrate, or on a separate substrate.

There are some existing schemes for the HCC. For example, a HCC including a complementary open-loop resonator is proposed. The complementary open-loop resonator is integrated in a conducting pattern of the HCC, to produce a shunt resonator that is configured to act as a short-circuit termination on at least one tuned frequency.

This section introduces aspects that may facilitate a better understanding of the disclosure. Accordingly, the statements of this section are to be read in this light and are not to be understood as admissions about what is in the prior art or what is not in the prior art.

SUMMARY

The inventor has found that in existing solutions, for example, the HCC is implemented by being embedded into a conducting pattern. Therefore, some harmonic bands (such as the $2^{nd}$ harmonic band and/or the $3^{rd}$ harmonic band) suppression may not be implemented independently.

In addition, a bias line is quite sensitive such that the bias line is difficult to be implemented when the HCC is quite close to a drain/collector of a power transistor. The HCC may subject to some variations and may impact one or more fundamental components during matching a network. That is to say, a harmonic termination is not independent from a fundamental matching.

In addition, a "shunt" structure of some harmonic bands (such as the $2^{nd}$ harmonic band and/or the $3^{rd}$ harmonic band) of a quarter wave length may take up more space and is not sufficiently compact.

To solve at least part of the above problems, a radio frequency power amplifier and a device are provided in the present disclosure. It may be appreciated that embodiments of the present disclosure are not limited to a multiple input multiple output (MIMO) transmitter, but could be more widely applied to any application scenario where similar problems exist.

Various embodiments of the present disclosure mainly aim at providing a radio frequency power amplifier, for example, configured in a multiple input multiple output (MIMO) transmitter. The transmitter could be, for example, configured in a terminal device or a network device.

Other features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a solution of a radio frequency power amplifier and a device to overcome the one or more problems pointed out in the above description.

In a first aspect, a radio frequency power amplifier is provided. The radio frequency power amplifier includes a harmonic control circuit which includes at least one edge-coupling resonator.

The edge-coupling resonator at least includes a first microstrip line, a second microstrip line and a first transmission line; the second microstrip line and the first microstrip line are coupled; and one end of the second microstrip line is an open stub and another end of the second microstrip line is grounded; and the first microstrip line having a first width is connected to the first transmission line having a second width which is wider than the first width.

In one embodiment, the harmonic control circuit is included in a conducting pattern; the power amplifier further includes: a planar dielectric substrate; a first conducting layer disposed on a first side of the planar dielectric substrate, and a second conducting layer disposed on a second side of the planar dielectric substrate.

The first conducting layer has the conducting pattern; the second conducting layer acts as a ground plane; and the second side of the planar dielectric substrate is opposite to the first side of the planar dielectric substrate.

In one embodiment, a first capacitance for harmonic suppression is formed by coupling the first microstrip line and the second microstrip line; and a first step impedance transformer for fundamental matching is formed by differencing widths of the first transmission line and the first microstrip line.

In one embodiment, a length of the first microstrip line is longer than or equal to a length of the second microstrip line.

In one embodiment, the edge-coupling resonator further includes a third microstrip line and a fourth microstrip line; the fourth microstrip line and the third microstrip line are coupled; one end of the fourth microstrip line is an open stub and another end of the fourth microstrip line is grounded.

In one embodiment, a length of the third microstrip line is longer than or equal to a length of the fourth microstrip line.

In one embodiment, a second capacitance for harmonic suppression is formed by coupling the third microstrip line and the fourth microstrip line.

In one embodiment, the first microstrip line is connected to the third microstrip line having the first width via a second transmission line having the second width; and a second step impedance transformer for fundamental matching is formed by differencing widths of the first microstrip line and the second transmission line; and a third step impedance transformer for fundamental matching is formed by differencing widths of the second transmission line and the third microstrip line.

In one embodiment, the edge-coupling resonator is used for a direct current coupling.

In one embodiment, the second microstrip line is connected to the fourth microstrip line via a grounded terminal; the second microstrip line and the fourth microstrip line are configured in a U-shape; and the second transmission line is configured in a U-shape.

In one embodiment, one end of the first microstrip line is an open stub and one end of the third microstrip line is an open stub.

In one embodiment, the edge-coupling resonator is used for an alternative current coupling.

In one embodiment, the edge-coupling resonator further comprises a fifth microstrip line and/or a sixth microstrip line; the fifth microstrip line and the first microstrip line are coupled, the sixth microstrip line and the third microstrip line are coupled; one end of the fifth microstrip line is an open stub and another end of the fifth microstrip line is grounded; one end of the sixth microstrip line is an open stub and another end of the sixth microstrip line is grounded.

In one embodiment, the fifth microstrip line is connected to the sixth microstrip line via a grounded terminal; and the fifth microstrip line and the sixth microstrip line are configured in a U-shape.

In one embodiment, at least two of the edge-coupling resonators are cascaded via at least one link microstrip line.

In one embodiment, the link microstrip line is configured in a U-shape.

In one embodiment, multiple edge-coupling resonators are cascaded together to provide a broad harmonic suppression bandwidth for a broadband application; and the more cascaded edge-coupling resonators are, the broader harmonic suppression bandwidth achieved at expense of suppression level is.

In one embodiment, the harmonic control circuit is configured in a signal path and/or in a bias path.

In a second aspect, a device is provided. The device includes the radio frequency power amplifier as illustrated in the first aspect.

In one embodiment, the device is a terminal device or a network device in a wireless communication system.

According to various embodiments of the present disclosure, a first microstrip line and a second microstrip line are coupled, one end of the second microstrip line is an open stub and another end of the second microstrip line is grounded; and the first microstrip line having a first width is connected to a first transmission line having a second width which is wider than the first width.

Therefore, some harmonic bands (such as the $2^{nd}$ harmonic band and/or the $3^{rd}$ harmonic band) suppression can be implemented independently. Furthermore, the harmonic termination is independent and may not impact one or more fundamental components during matching a network. In addition, it may not take up more space and is sufficiently compact. Furthermore, sufficient wide harmonic response bandwidth can be provided.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
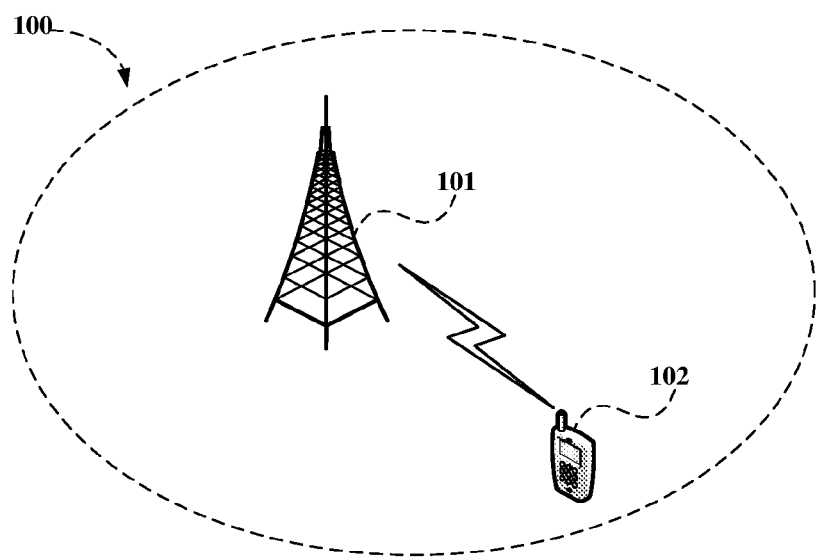
FIG. 1 is a schematic diagram of a wireless communication network.

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), a server, a controller or any other suitable device in the wireless communication network. The BS may be, for example, a node B (NodeB or NB), an evolved NodeB (eNodeB or eNB), a gNode B (gNB), a relay, a low power node such as a femto, a pico, and so forth.

Yet further examples of network device include multi-standard radio (MSR) radio equipment such as MSR BSs, base transceiver stations (BTSs), transmission points, and transmission nodes. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, a user equipment (UE), or other suitable devices. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, mobile phones, cellular phones, smart phones, tablets, wearable devices, personal digital assistants (PDA), vehicles, and the like.

The terminal device may support device-to-device (D2D) communication, for example by implementing a 3GPP standard for sidelink communication, and may in this case be referred to as a D2D communication device.

As yet another specific example, in an Internet of Things (IoT) scenario, a terminal device may represent a machine or other device that performs monitoring and/or measurements, and transmits the results of such monitoring and/or measurements to another terminal device and/or a network equipment. The terminal device may in this case be a machine-to-machine (M2M) device, which may in a 3GPP context be referred to as a machine-type communication (MTC) device.

As one particular example, the terminal device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearable computing device such as watches etc. In other scenarios, a terminal device may represent a vehicle or other equipment that is capable of monitoring and/or reporting on its operational status or other functions associated with its operation.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures.

FIG. 1 shows a schematic diagram of a wireless communication network 100 in which embodiments of the disclosure may be implemented. As shown in FIG. 1, the wireless communication network 100 may include one or more network devices, for example network devices 101.

It will be appreciated that the network device 101 could also be in a form of gNB, Node B, eNB, BTS (Base Transceiver Station), BSS (Base Station Subsystem), access point (AP) and the like. The network device 101 may provide radio connectivity to a set of terminal devices or UEs 102-1, 102-2, . . . , 102-N (collectively referred to as "terminal device(s) 102) within its coverage, where N is a natural number.

The network device 101 includes processing circuitry, device readable medium, interface, user interface equipment, auxiliary equipment, power source, power delivery circuitry, and antenna. These components are depicted as single boxes located within a single larger box, and in some cases, contain additional boxes therein.

In practice, however, the network device 101 may include multiple different physical components that make up a single illustrated component (e.g., interface includes ports/terminals for coupling wires for a wired connection and radio front end circuitry for a wireless connection). As another example, the network device 101 may be a virtual network node. Similarly, a network node may be composed of multiple physically separate components (e.g., a NodeB component, a RNC component, a BTS component and a BSC component, etc.), which may each have their own respective components.

In certain scenarios in which a network device includes multiple separate components (e.g., BTS and BSC components), one or more of the separate components may be shared among several network nodes. For example, a single RNC may control multiple NodeBs. In such a scenario, each unique NodeB and RNC pair may in some instances be considered a single separate network node. In some embodiments, a network node may be configured to support multiple radio access technologies (RATs). In such embodiments, some components may be duplicated (e.g., separate device readable medium for the different RATs) and some components may be reused (e.g., the same antenna may be shared by the RATs).

Although the network device 101 illustrated in the example wireless communication network may represent a device that includes a particular combination of hardware components, other embodiments may include network nodes with different combinations of components. It is to be understood that a network device may include any suitable combination of hardware and/or software needed to perform the tasks, features, functions and methods disclosed herein.

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations.

Figure 2:
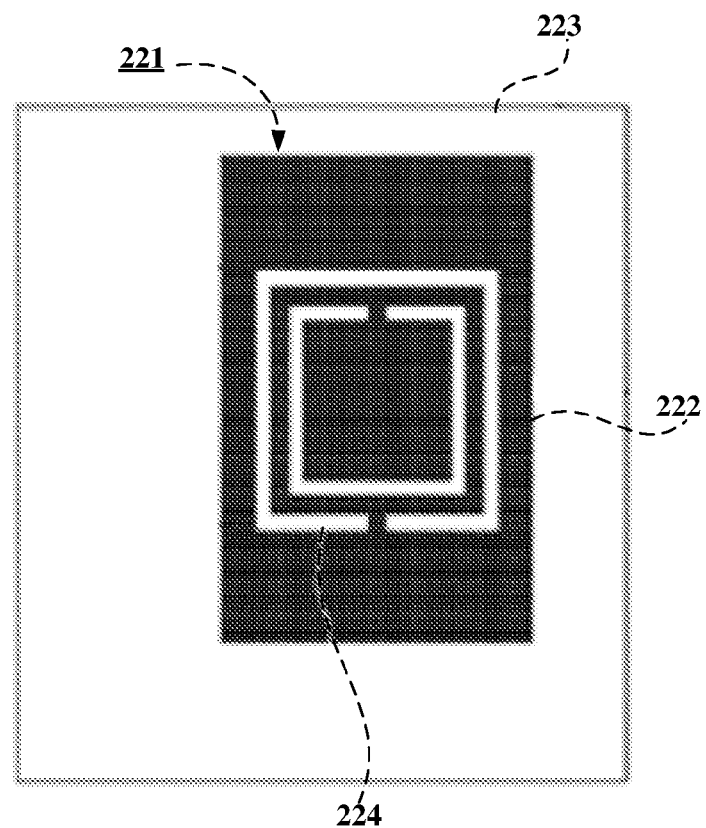
FIG. 2 is a schematic diagram which shows a HCC including a shunt resonator in existing technologies.

FIG. 2 is a schematic diagram which shows a HCC 221 including a shunt resonator. As shown in FIG. 2, the HCC 221 is included in a conducting pattern 222, which is provided on a first conducting layer; the first conducting layer is disposed on a first side of a planar dielectric substrate 223, and a second conducting layer is disposed on a second side of the planar dielectric substrate 223. The second conducting layer acts as a ground plane; and the second side of the planar dielectric substrate 223 is opposite to the first side of the planar dielectric substrate 223.

As shown in FIG. 2, the HCC 221 includes a complementary open-loop resonator 224 that is integrated in the conducting pattern 222, to produce a shunt resonator that is configured to act as a short-circuit termination on at least one tuned frequency. In addition, the conducting pattern 222 with the integrated complementary open-loop resonator 224 may be part of either a matching network or a bias network of a radio frequency device.

However, the HCC 221 is embedded into a conducting pattern. Therefore, some harmonic bands (such as the $2^{nd}$ harmonic band and/or the $3^{rd}$ harmonic band) suppression may not be implemented independently.

In addition, a bias line is quite sensitive such that the bias line is difficult to be implemented for the HCC. The HCC may subject to some variations and may impact one or more fundamental components during matching a network. That is to say, the harmonic termination is not independent.

In addition, a "shunt" structure of some harmonic bands (such as the $2^{nd}$ harmonic band and/or the $3^{rd}$ harmonic band) of a quarter wave length may take up more space and is not sufficiently compact.

A First Aspect of Embodiments

A radio frequency power amplifier is provided in these embodiments. The radio frequency power amplifier may be implemented at a transmitter, such as a MIMO transmitter at a terminal device or at a network device.

In this disclosure, such as the HCC is provided by using edge-coupling microstrip lines and is independent of fundamental components of signal. The HCC can be realized in either integrated circuitry or printed circuitry board (PCB). It is quite easy by integrating both harmonic termination together with fundamental frequency. For example, it may be used for a gallium nitride high electron mobility transistor (GaN HEMT) power amplifier where the 2nd harmonic suppression is required.

In this disclosure, the radio frequency power amplifier includes at least one HCC. For example, the HCC may be included in a conducting pattern. The radio frequency power amplifier may further include: a planar dielectric substrate; a first conducting layer disposed on a first side of the planar dielectric substrate, and a second conducting layer disposed on a second side of the planar dielectric substrate; the first conducting layer has the conducting pattern; the second conducting layer acts as a ground plane; and the second side of the planar dielectric substrate is opposite to the first side of the planar dielectric substrate.

Figure 3:
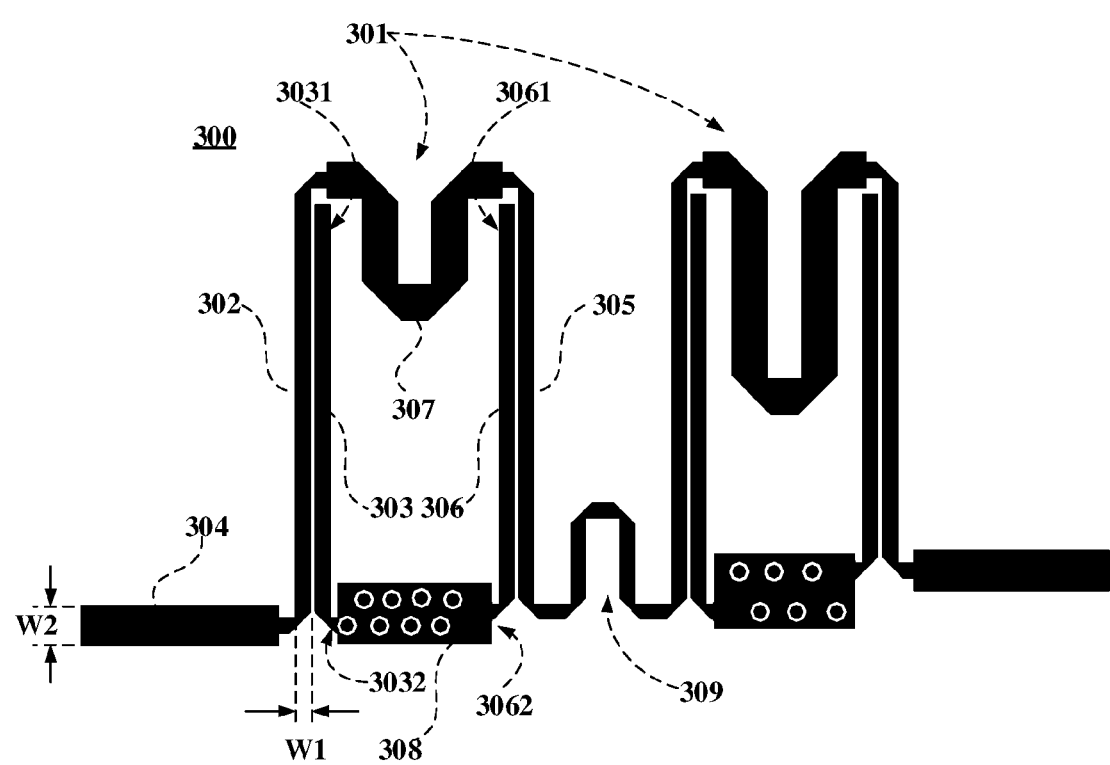
FIG. 3 is a schematic diagram which illustrates the HCC in accordance with an embodiment of the present disclosure.

FIG. 3 is a schematic diagram which illustrates a HCC 300 in accordance with an embodiment of the present disclosure. As shown in FIG. 3, the HCC 300 includes at least one edge-coupling resonator 301; for example, two edge-coupling resonators 301 are illustrated as examples and it is not limited thereto.

In an embodiment, for example, the HCC 300 may be incorporated with a signal path by edge coupling effect at a specific position of an output matching network. The HCC 300 of the radio frequency power amplifier may be included in an active device (e.g. a GaN HEMT power transistor) including one input terminal and one output terminal.

As shown in FIG. 3, the edge-coupling resonator 301 at least includes a first microstrip line 302, a second microstrip line 303 and a first transmission line 304; the second microstrip line 303 and the first microstrip line 302 are coupled.

One end 3031 of the second microstrip line 303 is an open stub and another end 3032 of the second microstrip line 303 is grounded; and the first microstrip line 302 having a first width (W1) is connected to the first transmission line 304 having a second width (W2) which is wider than the first width (W1).

In an embodiment, a first capacitance for harmonic suppression is formed by coupling the first microstrip line 302 and the second microstrip line 303; and a first step impedance transformer for fundamental matching is formed by differencing widths (such as W2 and W1) of the first transmission line 304 and the first microstrip line 302.

Therefore, some harmonic bands (such as the $2^{nd}$ harmonic band and/or the $3^{rd}$ harmonic band) suppression are implemented independently. Furthermore, the harmonic termination is independent and may not impact one or more fundamental components during matching a network. In addition, it may not take up more space and is sufficiently compact. Furthermore, sufficient wide harmonic response bandwidth may be provided.

In an embodiment, as for the "edge coupling" or "open coupling", for example, at least two microstrip lines are used; at least one of the microstrip lines has an open coupled stub and the open coupled stub remains a vacant state. But it is not limited thereto, details of the "edge coupling" or "open coupling" could refer to relevant arts.

As shown in FIG. 3, the edge-coupling resonator 301 may further include a third microstrip line 305 and a fourth microstrip line 306; the fourth microstrip line 306 and the third microstrip line 305 are coupled; one end 3061 of the fourth microstrip line 306 is an open stub and another end 3062 of the fourth microstrip line 306 is grounded.

In an embodiment, a second capacitance for harmonic suppression is formed by coupling the third microstrip line 305 and the fourth microstrip line 306.

As shown in FIG. 3, the first microstrip line 302 may be connected to the third microstrip line 305 having the first width (W1) via a second transmission line 307 having the second width (W2). Therefore, the edge-coupling resonator 300 can be used for a direct current (DC) coupling.

In an embodiment, a second step impedance transformer for fundamental matching is formed by differencing widths (such as W1 and W2) of the first microstrip line 302 and the second transmission line 307; and a third step impedance transformer for fundamental matching is formed by differencing widths (such as W2 and W1) of the second transmission line 307 and the third microstrip line 305.

Therefore, some harmonic bands (such as the $2^{nd}$ harmonic band and/or the $3^{rd}$ harmonic band) suppression are implemented independently. Furthermore, the harmonic termination is further independent and may not impact one or more fundamental components during matching a network.

As shown in FIG. 3, the second microstrip line 303 may be connected to the fourth microstrip line 306 via a grounded terminal 308. For example, some holes are formed in the grounded terminal 308, such that the second microstrip line 303 and the fourth microstrip line 306 are grounded via the holes to the ground plane.

As shown in FIG. 3, the second microstrip line 303 and the fourth microstrip line 306 may be configured in a U-shape; and the second transmission line 307 may be configured in a U-shape. Therefore, it may further not take up more space and is further sufficiently compact.

In an embodiment, at least two of the edge-coupling resonators may be cascaded via at least one link microstrip line. Multiple edge-coupling resonators can be cascaded together to provide a broad harmonic suppression bandwidth for a broadband application; and the more cascaded edge-coupling resonators are, the broader harmonic suppression bandwidth achieved at expense of suppression level is.

As shown in FIG. 3, two edge-coupling resonators 301 are cascaded via a link microstrip line 309; and the link microstrip line 309 may be configured in a U-shape. However, it is not limited thereto, more units cascading together will bright about wider harmonic suppression bandwidth and deeper suppression level, which is trading off the HCC compactness.

In this disclosure, the fundamental matching can be guaranteed by the step impedance in signal path, while the harmonic suppression can be provided by the edge-coupled portion of the edge-coupled line alone. Therefore, the fundamental matching and harmonic tuning can be designed complete independently.

Moreover, more resonator unit cascading can increase a rejection at the second harmonic band and can be better matched at the fundamental frequency band. The inter-stage between resonator units is a high impedance line which could be seen as the extended line of one part of the edge-coupled line. The link microstrip line and/or the edge-coupled line can be bent into "U-shape" for compactness.

It should be appreciated that FIG. 3 is only an example of the disclosure, it is not limited thereto. For example, the links between blocks (or modules, components, and so on) may be adjusted and/or some blocks (or modules, components, and so on) may be omitted. Moreover, some blocks (or modules, components, and so on) not shown in FIG. 3 may be added.

Next the coupled microstrip lines will be further illustrated as examples.

In an embodiment, the coupled microstrip lines may include open coupled stubs and may be broadband equivalents of an impedance quarter wavelength transmission line. As for the "equivalents" or "equivalent" or "equivalently", for example, they are some generic terms in the arts, and it is not limited thereto, details of those terms could refer to relevant arts.

Figure 4:
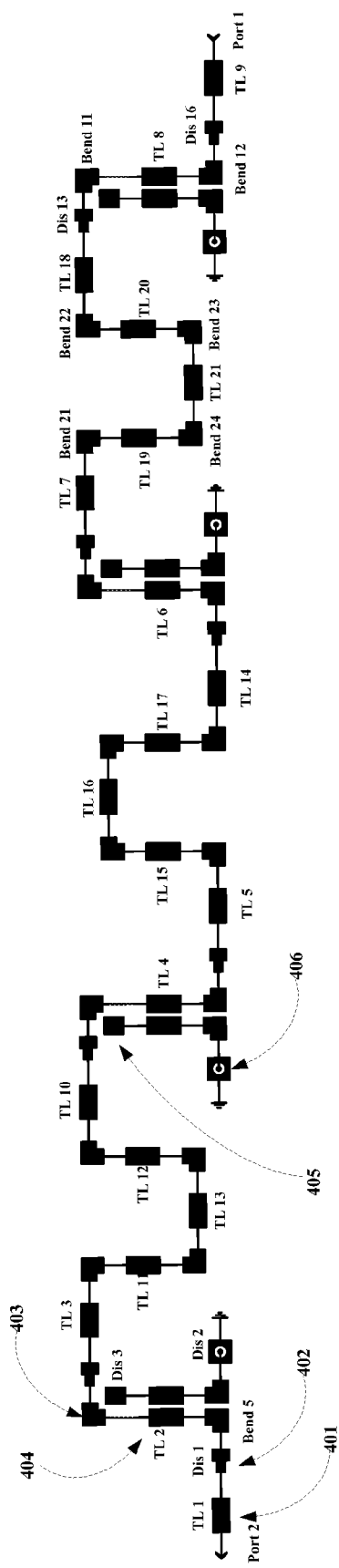
FIG. 4 is a schematic diagram which shows an equivalent example of the HCC in accordance with an embodiment of the present disclosure.

FIG. 4 is a schematic diagram which shows an equivalent example of the HCC in accordance with an embodiment of the present disclosure. The open coupled stub could be equivalent of a single section transmission line.

As shown in FIG. 4, the HCC 300 of FIG. 3 is implemented in a microstrip line schematic diagram. For example, there are six elements for the overall structure, such as a transmission line 401, a step impedance 402, an optimal miter bend 403, multiple coupled microstrip lines (e.g. 2-coupled-ustrip or 3-coupled-ustrip) 404, a microstrip end 405, and a microstrip terminal via hole to ground 406. For the sake of simplicity and clarification, only parts of the elements are marked in the FIG. 4.

For example, their arrangements in FIG. 4 are: Port 1 is connected to a transmission line (TL 9) with width as WLead (such as 1.129 mm) and length as Llead (such as 5.269 mm); TL 9 connected to TL 8 which is a 2-symmetrical coupled microstrip line via a step impedance (Dis 16) and an optimal miter bend (Bend 12); the first part of TL 8 is further connected to TL 18 via Dis 13 and Bend 11; the second part of TL 8 is a microstrip line of which one end is open circuited and the other end is connected to the ground by via hole; the width, spacing and length of TL 8 are WC 4 (such as 0.4 mm), SC 4 (such as 0.176 mm) and L 4 (such as 10.074 mm); bend elements around are using WC 4 as width.

For example, actually TL18, Bend 22, TL 20, Bend 23, TL 21, Bend 24, TL 19, Bend 21 and TL 7 are configured in a "U-shape", which is a lower impedance transmission line connected to another edge-coupled microstrip line TL 6; TL 14 is an inter-unit connection transmission line which bridges more resonator units; the resonator units are cascaded together to obtain better performance. The other parts are the same structure as above but with different values of dimension of transmission lines and edge coupling lines.

In an embodiment, there are a plurality of dimensional variables that can be tuned to optimize the performance for harmonic termination, so as to meet target requirements.

It should be appreciated that some parameters (such as 1.129 mm, and so on) and/or elements (or components) in FIG. 4 are examples in order to illustrate the scheme of this disclosure, but it is not limited thereto. Furthermore, details of some parameters, such as TL (transmission line), CTL (coupled transmission line), as examples in FIG. 4 could refer to existing technologies.

In an embodiment, a length of the first microstrip line is longer than or equal to a length of the second microstrip line, and/or, a length of the third microstrip line is longer than or equal to a length of the fourth microstrip line.

For example, as shown in FIG. 3, a length (L1) of the first microstrip line 302 is equal to a length (L2) of the second microstrip line 303; a length (L3) of the third microstrip line 305 is equal to a length (L4) of the fourth microstrip line 306.

Figure 5:
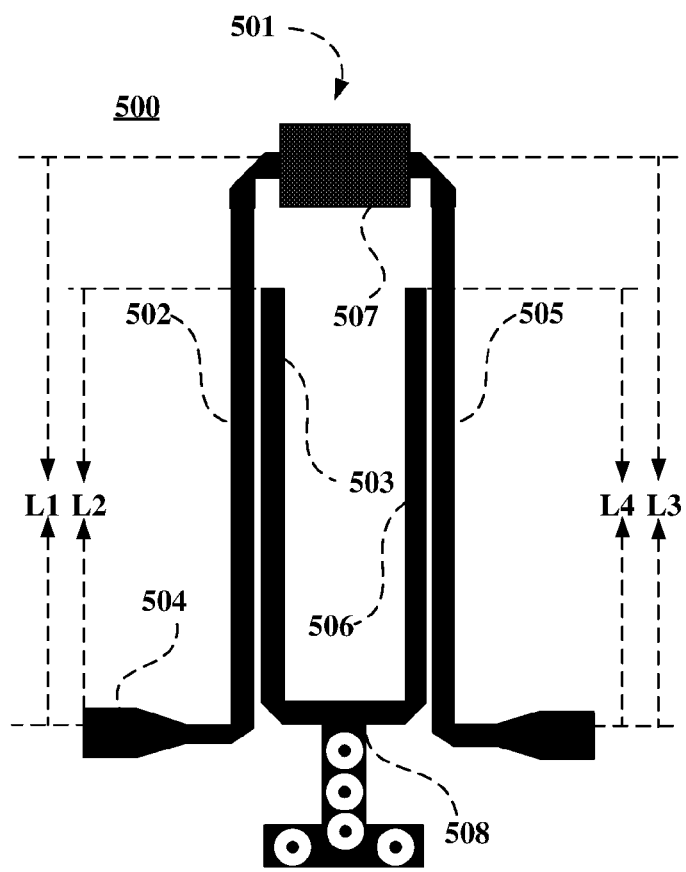
FIG. 5 is another schematic diagram which illustrates the HCC in accordance with an embodiment of the present disclosure.

FIG. 5 is another schematic diagram which illustrates a HCC 500 in accordance with an embodiment of the present disclosure. As shown in FIG. 5, the HCC 500 includes at least one edge-coupling resonator 501.

As shown in FIG. 5, the edge-coupling resonator 501 at least includes a first microstrip line 502, a second microstrip line 503 and a first transmission line 504; the second microstrip line 503 and the first microstrip line 502 are coupled; a length (L1) of the first microstrip line 502 is longer than a length (L2) of the second microstrip line 503.

As shown in FIG. 5, the edge-coupling resonator 501 may further include a third microstrip line 505 and a fourth microstrip line 506; the fourth microstrip line 506 and the third microstrip line 505 are coupled; a length (L3) of the third microstrip line 505 is longer than a length (L4) of the fourth microstrip line 506.

As shown in FIG. 5, the first microstrip line 502 may be connected to the third microstrip line 505 via a second transmission line 507. Therefore, the edge-coupling resonator 501 can be used for a direct current (DC) coupling.

As shown in FIG. 5, the second microstrip line 503 may be connected to the fourth microstrip line 506 via a grounded terminal 508. The second microstrip line 503 and the fourth microstrip line 506 may be configured in a U-shape. Therefore, it may further not take up more space and is further sufficiently compact.

Besides using 2-symmetrical coupled lines as shown in FIG. 3 and FIG. 5, 3-symmetrical coupled line could also be used for this disclosure. Therefore, the present disclosure is not limited to the coupled line structure.

Figure 6:
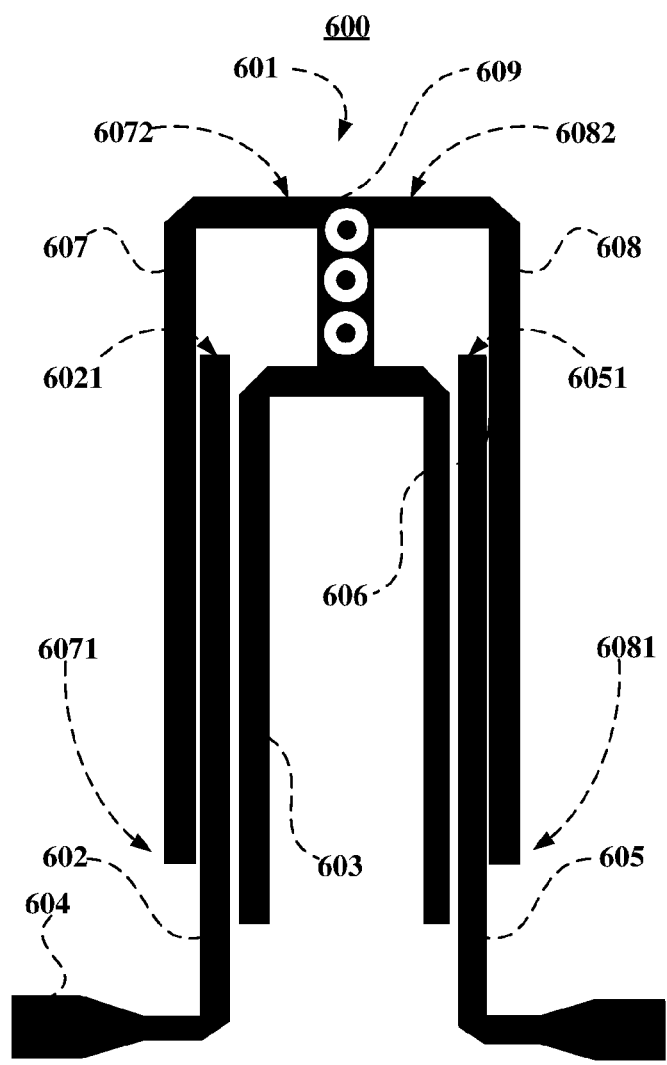
FIG. 6 is another schematic diagram which illustrates the HCC in accordance with an embodiment of the present disclosure.

FIG. 6 is another schematic diagram which illustrates a HCC 600 in accordance with an embodiment of the present disclosure. As shown in FIG. 6, the HCC 600 includes at least one edge-coupling resonator 601.

As shown in FIG. 6, the edge-coupling resonator 601 at least includes a first microstrip line 602, a second microstrip line 603 and a first transmission line 604; the second microstrip line 603 and the first microstrip line 602 are coupled.

As shown in FIG. 6, the edge-coupling resonator 601 may further include a third microstrip line 605 and a fourth microstrip line 606; the fourth microstrip line 606 and the third microstrip line 605 are coupled.

As shown in FIG. 6, one end 6021 of the first microstrip line 602 is an open stub and one end 6051 of the third microstrip line 605 is an open stub. Therefore, the edge-coupling resonator 601 may be used for an alternative current (AC) coupling.

As shown in FIG. 6, the edge-coupling resonator 601 may further include a fifth microstrip line 607 and/or a sixth microstrip line 608; the fifth microstrip line 607 and the first microstrip line 602 are coupled, the sixth microstrip line 608 and the third microstrip line 605 are coupled.

As shown in FIG. 6, one end 6071 of the fifth microstrip line 607 is an open stub and another end 6072 of the fifth microstrip line 607 is grounded; one end 6081 of the sixth microstrip line 608 is an open stub and another end 6082 of the sixth microstrip line 608 is grounded. The fifth microstrip line 607 is connected to the sixth microstrip line 608 via a grounded terminal 609; the fifth microstrip line 607 and the sixth microstrip line 608 are configured in a U-shape.

In an embodiment, the 3-symmetrical coupled line structure can realize an AC-coupled HCC, which can play a role of AC-coupled capacitor. It may be beneficial because this structure can substitute the AC-coupled capacitor with lower cost and higher reliability, so as to support extreme high-power applications.

It should be appreciated that FIGS. 5-6 are only examples of the disclosure, it is not limited thereto. For example, the links between blocks (or modules, components, and so on) may be adjusted and/or some blocks (or modules, components, and so on) may be omitted. Moreover, some blocks (or modules, components, and so on) not shown in FIGS. 5-6 may be added.

Moreover, only one edge-coupling resonator is illustrated as an example in FIGS. 5-6, and it is not limited thereto; for example, at least two of the edge-coupling resonators shown in FIGS. 5-6 can be cascaded.

In an embodiment, the harmonic control circuit may be configured in a signal path and/or may be configured in a bias path.

Figure 7:
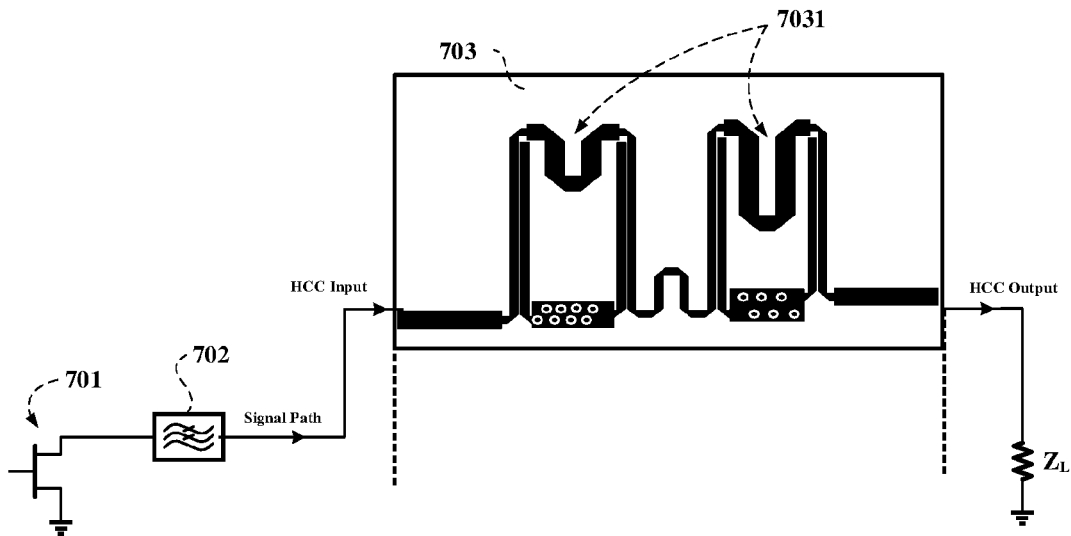
FIG. 7 is a schematic diagram which illustrates the HCC configured in a signal path in accordance with an embodiment of the present disclosure.

FIG. 7 is a schematic diagram which illustrates the HCC configured in a signal path in accordance with an embodiment of the present disclosure. As shown in FIG. 7, for example, a signal path is formed between a transistor 701 and an electrical element $Z_L$. An output matching network 702 and a HCC 703 are configured in the signal path. For example, the HCC 703 includes at least two edge-coupling resonators 7031.

Figure 8:
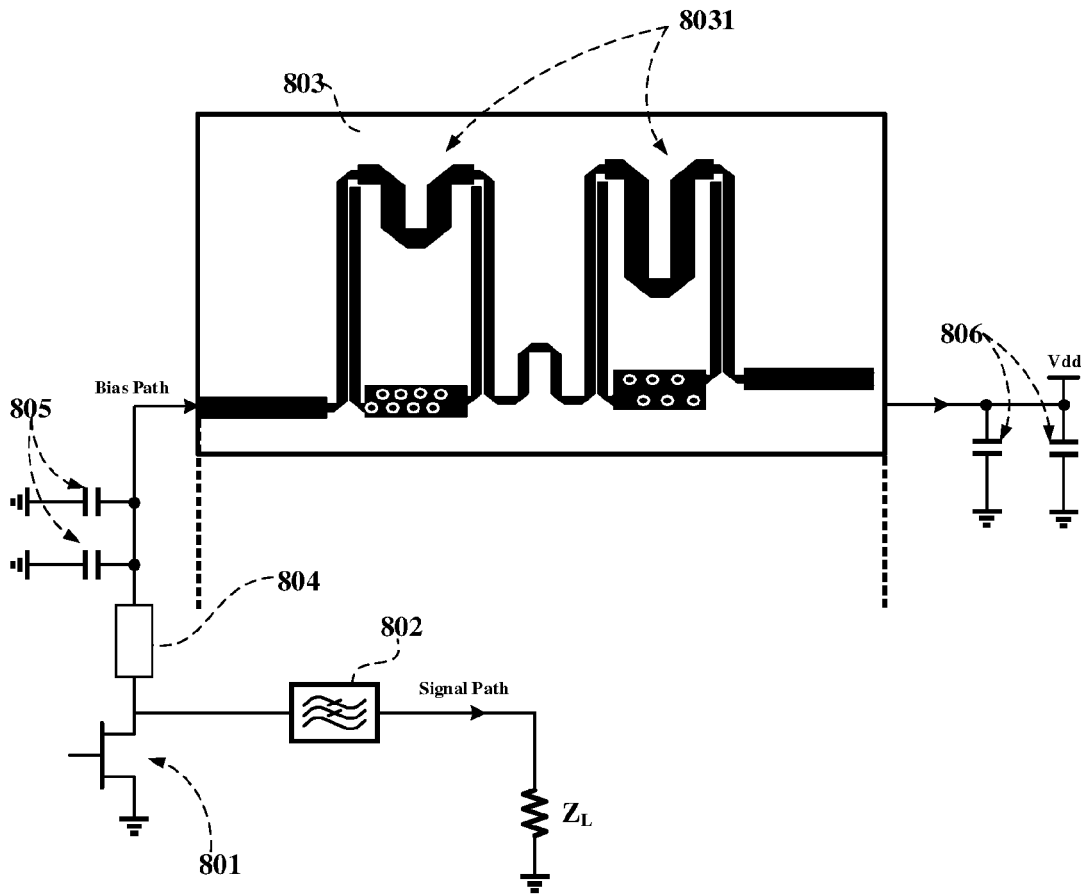
FIG. 8 is a schematic diagram which illustrates the HCC configured in a bias path in accordance with an embodiment of the present disclosure.

FIG. 8 is a schematic diagram which illustrates the HCC configured in a bias path in accordance with an embodiment of the present disclosure. As shown in FIG. 8, for example, a signal path is formed between a transistor 801 and an electrical element $Z_L$; and a bias path is formed between the transistor 801 and a voltage terminal $V_{dd}$; an output matching network 802 is configured in the signal path and a HCC 803 is configured in the bias path.

For example, the HCC 803 includes at least two edge-coupling resonators 8031. Furthermore, there are some other elements, such as a quarter wave line 804, radio frequency bypass capacitors 805 and/or direct current bypass capacitors 806.

As shown in FIGS. 7 and 8, the arrangement/placement of the HCC is also quite flexible. Whatever, an input port impedance of the HCC can be rotated around a Smith chart by adding additional phase compensation before an input port. The HCC may rotate around the Smith chart to reach arbitrary open/short circuit terminations for harmonics by adding an incremental electrical length of an offset transmission line before the input port.

In an embodiment, the HCC can include more than one different unit arranged in parallel in the conducting pattern, in order to realize multiple harmonics control, wide-band harmonic control or a combination of both. For example, each unit may cover at least two adjacent harmonic frequencies.

One advantage is that the HCC provides high density and flexibility of integration within a high-power matching network. The branch placement makes it can be easily decoupled from the matching network or further enhance performance by adding it onto proper insertion position, because it is independent part for harmonic control.

In order to verify a concept of the HCC, advance design system (ADS) electromagnetic (EM) simulation is performed to design the $2^{nd}$ harmonic termination, for example, for Infineon GTVA180320FC device with the $2^{nd}$ harmonic load pull data. The device is a 160X2 twin GaN HEMT power transistor working at 1800 MHz to 1900 MHz.

Figure 9:
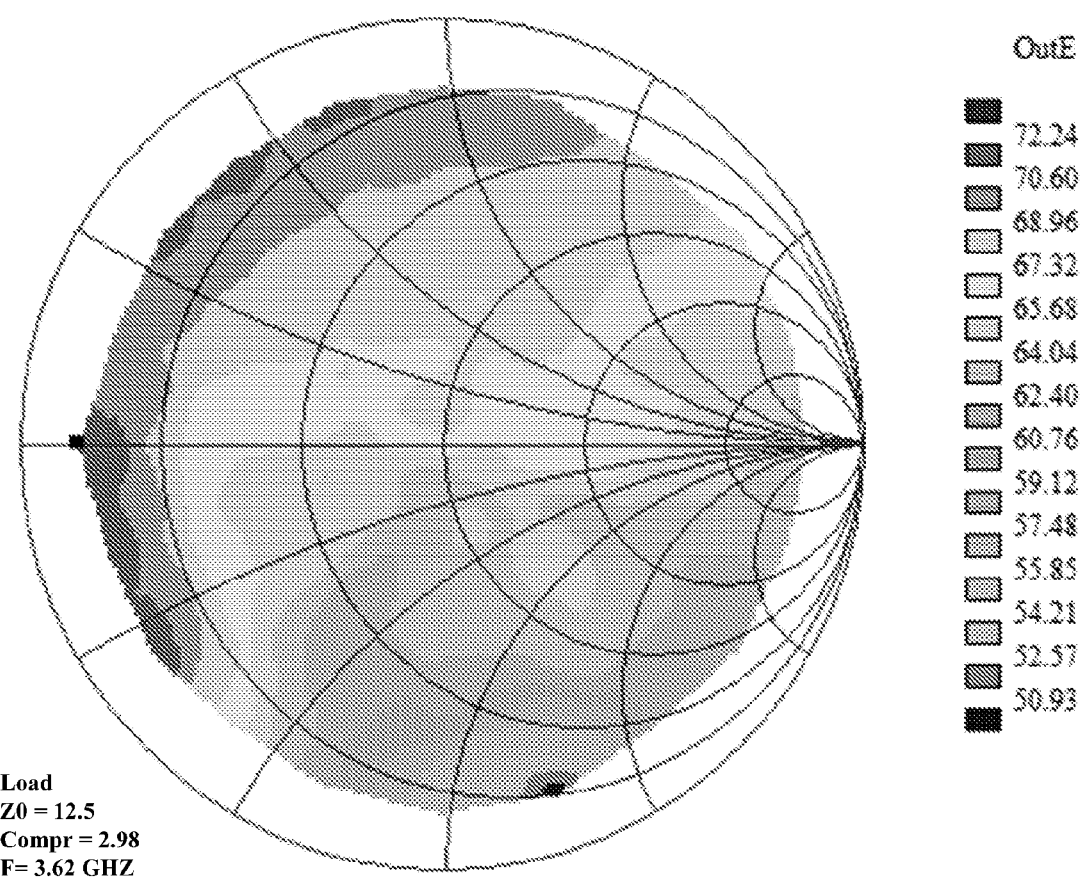
FIG. 9 is a schematic diagram which illustrates the $2^{nd}$ harmonic load pull data of GTVA180320FC in accordance with an embodiment of the present disclosure.
Figure 10:
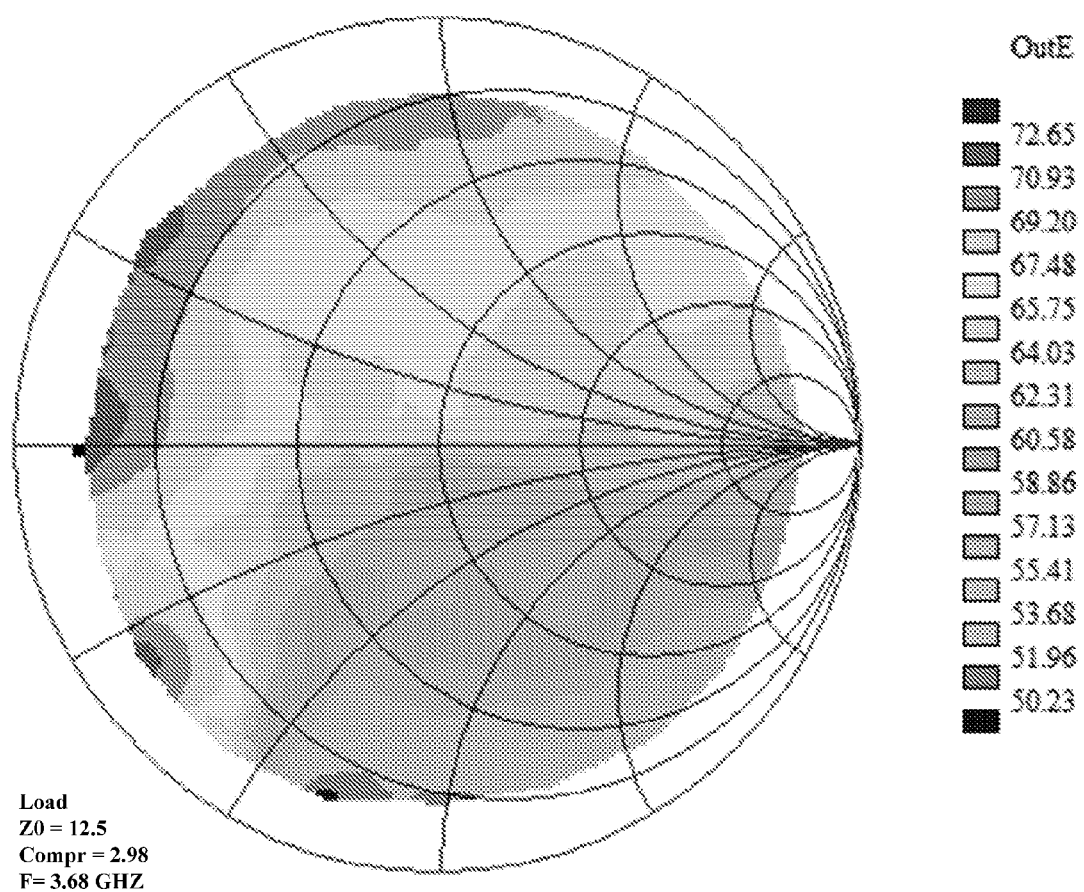
FIG. 10 is another schematic diagram which illustrates the $2^{nd}$ harmonic load pull data of GTVA180320FC in accordance with an embodiment of the present disclosure.
Figure 11:
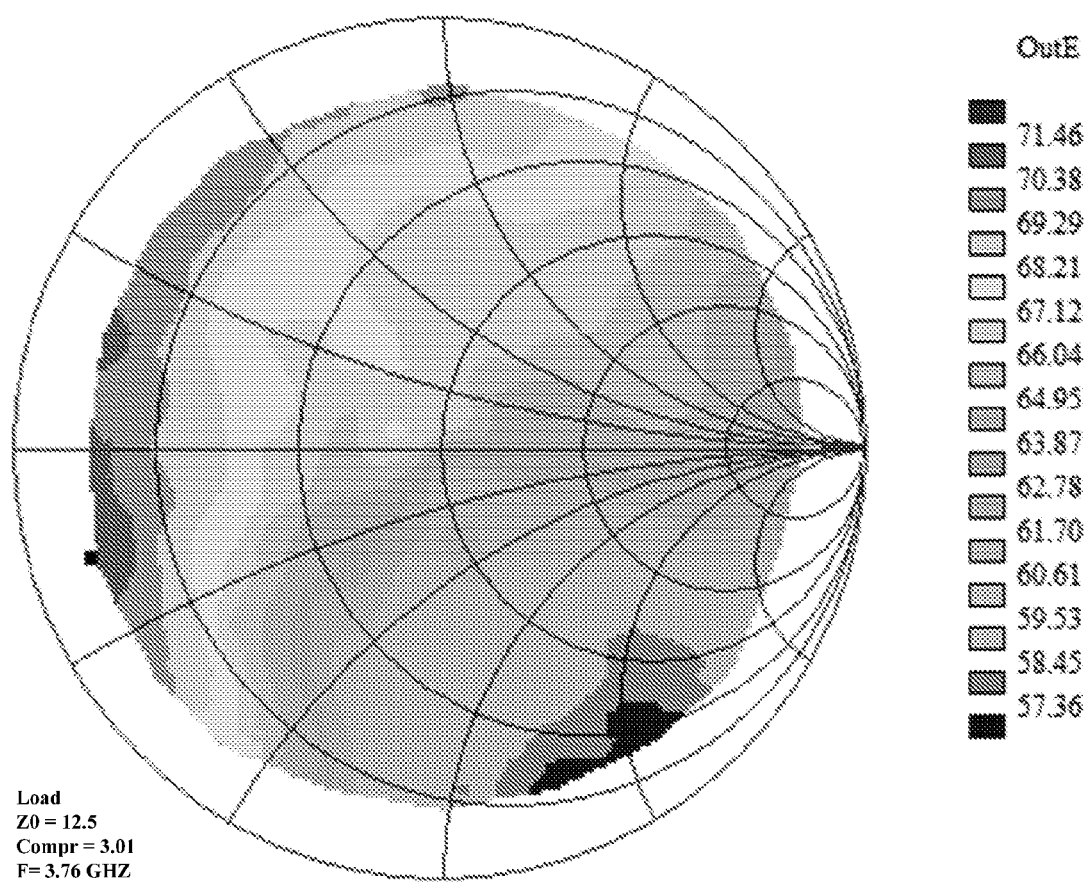
FIG. 11 is another schematic diagram which illustrates the $2^{nd}$ harmonic load pull data of GTVA180320FC in accordance with an embodiment of the present disclosure.

FIG. 9 is a schematic diagram which illustrates the $2^{nd}$ harmonic load pull data of GTVA180320FC in accordance with an embodiment of the present disclosure. FIG. 10 is another schematic diagram which illustrates the $2^{nd}$ harmonic load pull data of GTVA180320FC in accordance with an embodiment of the present disclosure. FIG. 11 is another schematic diagram which illustrates the $2^{nd}$ harmonic load pull data of GTVA180320FC in accordance with an embodiment of the present disclosure.

As shown in FIGS. 9-11, to maximize an efficiency performance by harmonic manipulation, a short-circuit impedance range at lower-left corner of the Smith chart is highly desired. Also, a phase compensation should also be considered for the HCC design.

Figure 12:
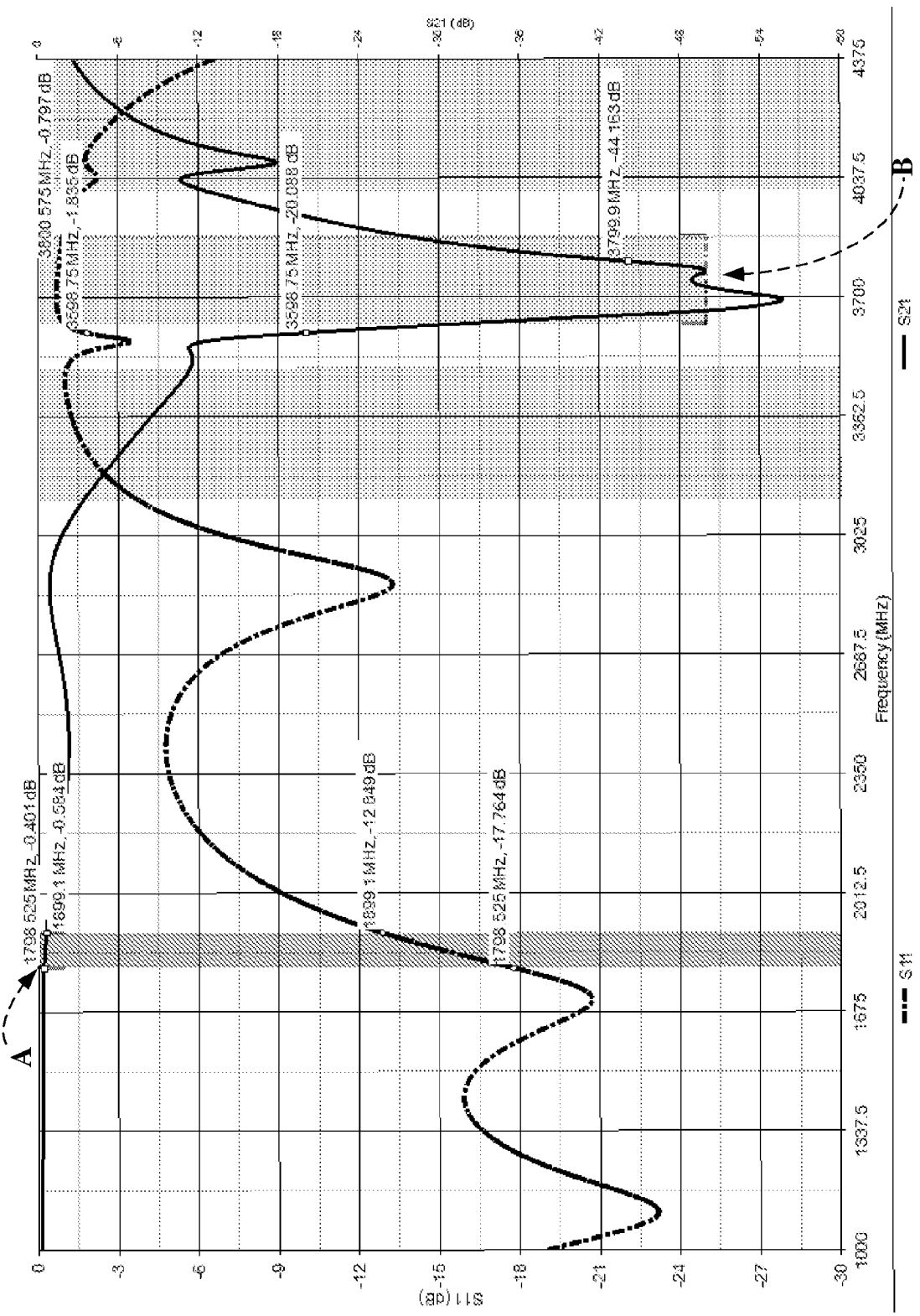
FIG. 12 is a schematic diagram which shows an example of the $2^{nd}$ harmonic suppression in accordance with an embodiment of the present disclosure.

FIG. 12 is a schematic diagram which shows an example of the $2^{nd}$ harmonic suppression in accordance with an embodiment of the present disclosure. In FIG. 12, a dB-plot of the EM simulated reflection and transmission of the HCC is illustrated and it is plotted under 50 Ohm impedance.

As shown in FIG. 12, a simulated reflection (i.e. return loss (RL), may be denoted by S11) in dB-scale of HCC input port versus frequency is represented with a dashed line. A simulated transmission (i.e. insertion loss (IL), may be denoted by S21) in dB-scale between an input port and an output port versus frequency is also shown, in a solid bold line.

In this exemplary embodiment, the fundamental frequency $f_0$ is considered to be 1.8-1.9 GHz band. It should be noted that any suitable value of $f_0$ can be used. At $f_0$, the HCC has a "through" characteristic (see A portion as shown in FIG. 12). Therefore, the HCC presents a good match to a port impedance. Since the HCC is targeting to be placed on the bias line, the bias line width is around 50 Ohm for fundamental matching. As can be seen in FIG. 12, RL is about −13 dB and IL is about 0 dB; that is to say, consequently nearly lossless transmission is performed under 50 Ohm system impedance plotting.

However, at the second harmonic i.e. at $2*f_0$: 3.6-3.8 GHz, the HCC presents a short-circuit termination to the input port. Thus, the HCC presents almost total reflection (0 dB RL) to the input port and consequently nearly perfect suppression (more than 40 dB IL at a center region). For frequencies approximating $2*f_0$, the HCC presents a low impedance approximating a short-circuit termination; for an arbitrary chosen suppression level (e.g. 10 dB), there exists a corresponding frequency range over which at least this suppression is maintained.

A normalized suppression bandwidth can be defined as a ratio between the frequency range and the center frequency where maximum suppression is obtained. For suppression level of 10 dB, the example in FIG. 12 corresponds to about 35% (see B portion as shown in FIG. 12) suppression bandwidth, while only 7.5% suppression bandwidth is obtained in traditional quarter wave line in existing arts. Therefore, the suppression bandwidth for $2^{nd}$ harmonic is much wider in this disclosure than the existing arts.

Figure 13:
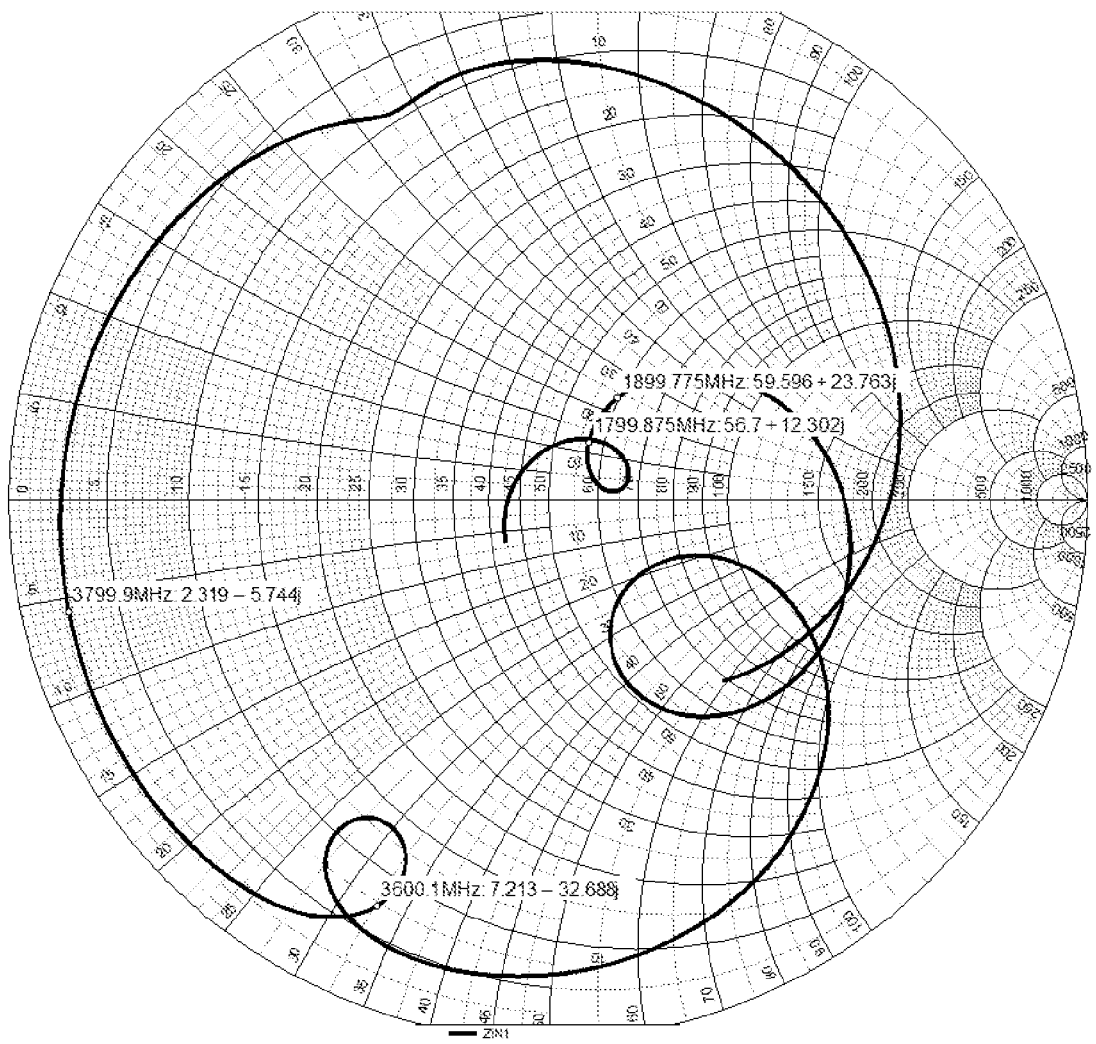
FIG. 13 is a schematic diagram which illustrates a Smith chart of the EM simulated input impedance of HCC in accordance with an embodiment of the present disclosure.

FIG. 13 is a schematic diagram which illustrates a Smith chart of the EM simulated input impedance of HCC in accordance with an embodiment of the present disclosure.

As shown in FIG. 13, a resulting EM simulated input impedance trace of this situation is presented in polar form in a Smith chart. To illustrate the behavior of the HCC, frequency range 1.8-1.9 GHz range represents fundamental frequency; the 3.6-3.8 GHz range represents 2nd harmonic frequency. Therefore, the 2nd harmonic trace is placed at the lower-left of the chart, which denotes a short-circuit termination for the design target; and the centered 1.8-1.9 GHz denotes a ~60 Ohm termination.

As can be seen, an acceptable short-circuit termination is presented at $2*f_0$ with real part of the impedance around 2.5 Ohm for most of frequency points. Thus, one unit of the HCC can realize a second harmonic short-circuit termination and fundamental frequency matching at the same time, which can also be seen that a nearly perfect match to 60 Ohm at fundamental frequency is the characteristic impedance of the bias line predefined.

As can be seen from the above embodiments, a second microstrip line and a first microstrip line are coupled, one end of the second microstrip line is an open stub and another end of the second microstrip line is grounded; and the first microstrip line having a first width is connected to a first transmission line having a second width which is wider than the first width.

A Second Aspect of Embodiments

Based on the first aspect of embodiments, a power amplifier is provided in the second aspect of embodiments. The power amplifier may include: a planar dielectric substrate; a first conducting layer disposed on a first side of the planar dielectric substrate, and a second conducting layer disposed on a second side of the planar dielectric substrate.

The first conducting layer has a conducting pattern including one or more of the harmonic control circuits as illustrated in the first aspect of embodiments; the second conducting layer acts as a ground plane; and the second side of the planar dielectric substrate is opposite to the first side of the planar dielectric substrate.

Figure 14:
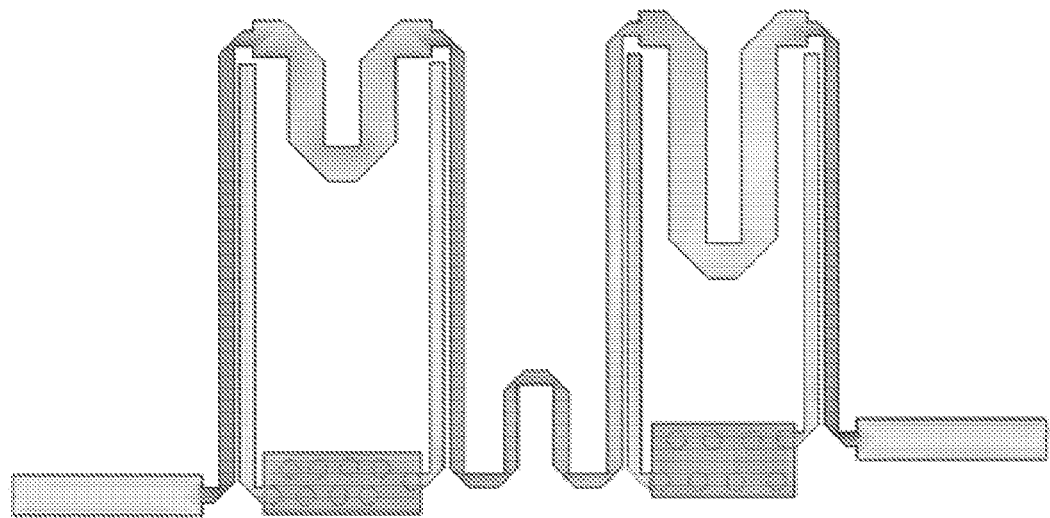
FIG. 14 is a schematic diagram which illustrates a top view of the HCC in accordance with an embodiment of the present disclosure.
Figure 15:
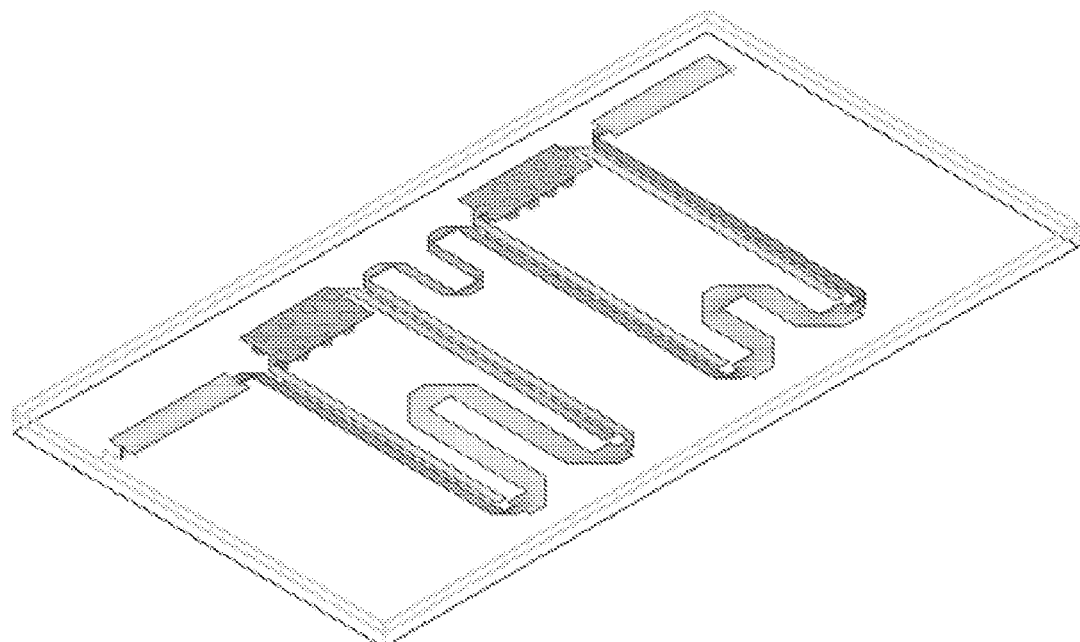
FIG. 15 is a schematic diagram which illustrates an isometric view of the HCC in accordance with an embodiment of the present disclosure.

FIG. 14 is a schematic diagram which illustrates a top view of the HCC in accordance with an embodiment of the present disclosure. FIG. 15 is a schematic diagram which illustrates an isometric view of the HCC in accordance with an embodiment of the present disclosure.

In an embodiment, the conducting pattern may be a part of a matching network of a radio frequency power amplifier.

Figure 16:
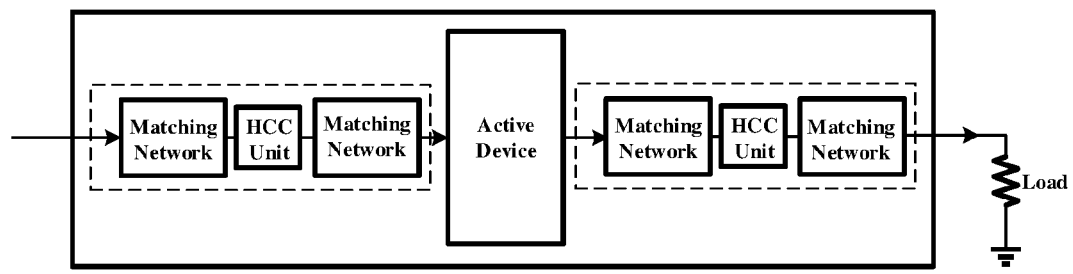
FIG. 16 is a block diagram which illustrates a radio frequency device incorporating one or more HCC units in accordance with an embodiment of the present disclosure.

FIG. 16 is a block diagram which illustrates a radio frequency device incorporating one or more HCC units in accordance with an embodiment of the present disclosure. As shown in FIG. 16, a general structure of an exemplary RF device (such as a power amplifier) is provided.

As shown in FIG. 16, the RF device may include an active device of which both input and output terminals are connected to HCC units of present disclosure for input and output harmonic termination purpose, here the HCC is shown as parts of either input or output matching networks. The active device is shown with a single input terminal. It should be noted that the active device may also include additional input terminals (such as Doherty, envelope tracking, dynamic load modulation etc.).

As shown in FIG. 16, for example, some HCC units are connected to the active device directly or indirectly. The HCC units are configured to receive either the input or output signal generated by the active device (such as Cgs, Cgd, Cds) and further configured to control at least two harmonics of a frequency band, by providing two short-circuit terminations at adjacent two tuned frequencies.

In another embodiment, the conducting pattern may be independent from a matching network of a radio frequency power amplifier.

Figure 17:
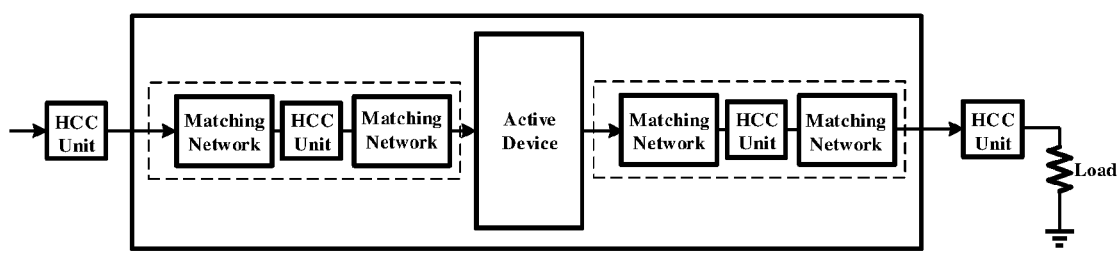
FIG. 17 is another block diagram which illustrates a radio frequency device incorporating one or more HCC units in accordance with an embodiment of the present disclosure.

FIG. 17 is another block diagram which illustrates a radio frequency device incorporating one or more HCC units in accordance with an embodiment of the present disclosure. As shown in FIG. 17, for example, some HCC units are independent from the matching networks. This feature brings about flexibility of using present disclosure for various application scenarios.

As can be seen from the above embodiments, high density and flexibility of integration are provided within a high-power matching network. The branch placement of the HCC makes it to be easily decoupled from the matching network or further enhance performance by adding it onto proper insertion position, since it is an independent part for harmonic control.

Furthermore, due to compact size of the HCC to cover at least two harmonic frequencies at the same time for harmonic control, it is compatible with a wide range of substrate based technologies.

In addition, The HCC may provide a robust short-circuit termination at RF without the need for a DC-blocking capacitor. The HCC may also exhibit much better harmonic suppression than traditional quarter wave line short-termination. The HCC can be either a part of matching network or being independent from the matching network.

A Third Aspect of Embodiments

A transmitter also is provided in an embodiment. Next a transmitter is illustrated as an example, but it is not limited thereto.

Figure 18:
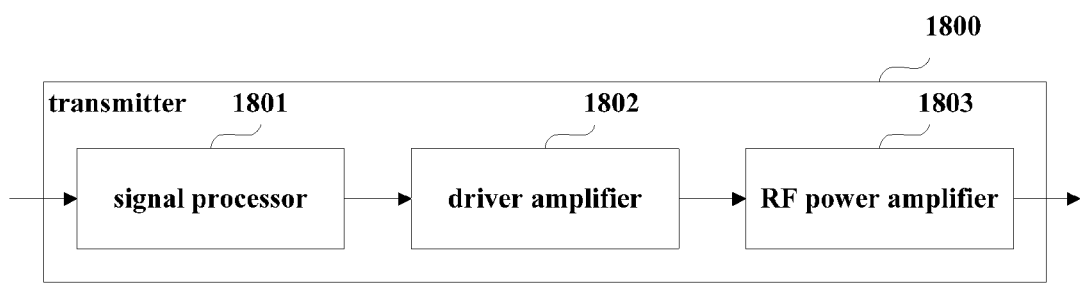
FIG. 18 shows a diagram of a transmitter in accordance with an embodiment of the present disclosure.

FIG. 18 shows a diagram of a transmitter 1800 in accordance with an embodiment of the present disclosure; as shown in FIG. 18, the transmitter 1800 includes a signal processor 1801, a driver amplifier 1802 and a radio frequency power amplifier 1803.

For the signal processor 1801 and the driver amplifier 1802, the existing solutions may be referred to, and for the radio frequency power amplifier 1803, the first aspect of embodiments may be referred to, which has been described in details in the first aspect of embodiments, and thus not be described herein any further.

A Fourth Aspect of Embodiments

A device is provided in the fourth aspect of embodiments.

Figure 19:
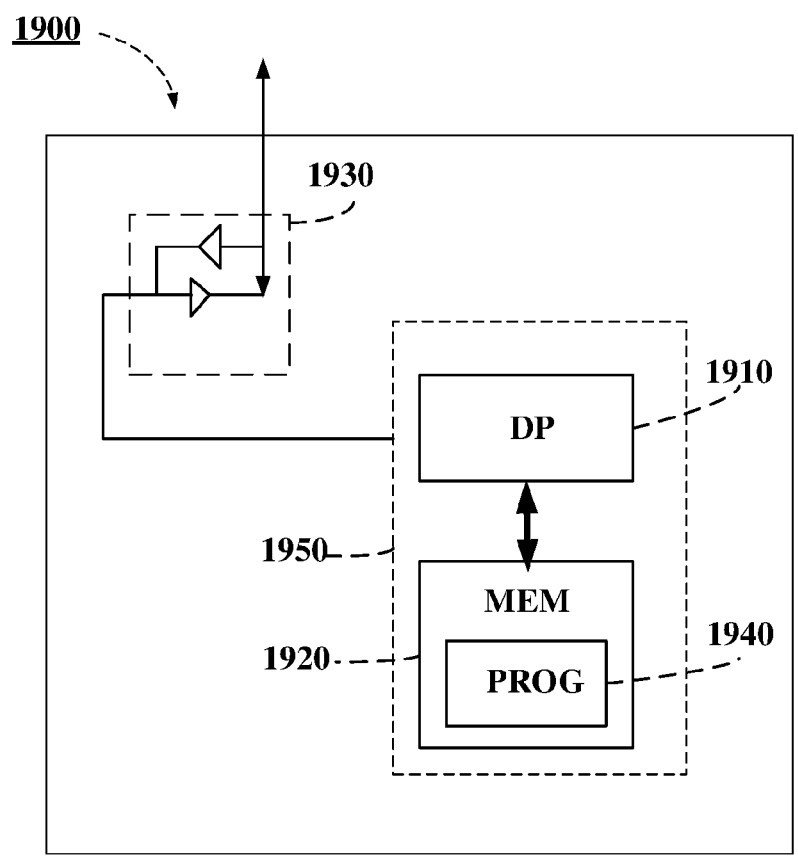
FIG. 19 shows a simplified block diagram of a device in accordance with an embodiment of the present disclosure.

FIG. 19 shows a simplified block diagram of a device 1900 in accordance with an embodiment of the present disclosure. It would be appreciated that the device 1900 may be implemented as at least a part of, for example, a network device or a terminal device, especially may be implemented as at least a part of, for example, a transmitter or a transceiver included in a network device or a terminal device.

As shown in FIG. 19, the device 1900 includes: a communicating means 1930 and a processing means 1950. The processing means 1950 includes a data processor (DP) 1910, a memory (MEM) 1920 coupled to the DP 1910. The communicating means 1930 is coupled to the DP 1910 in the processing means 1950. The MEM 1920 stores a program (PROG) 1940. The communicating means 1930 is for communications with other devices, which may be implemented as a transceiver for transmitting/receiving signals.

In some embodiments, the device 1900 acts as a network device, the processing means 1950 may be configured to perform signal processing to an input signal and obtain an output signal, and the communicating means 1930 may be configured to transmit the output signal or receive an output signal transmitted by a terminal device.

In some other embodiments, the device 1900 acts as a terminal device, the processing means 1950 may be configured to perform signal processing to an input signal and obtain an output signal, and the communicating means 1930 may be configured to transmit the output signal or receive an output signal transmitted by a network device.

The PROG 1940 is assumed to include program instructions that, when executed by the associated DP 1910, enable the device 1900 to operate in accordance with the embodiments of the present disclosure. The embodiments herein may be implemented by computer software executable by the DP 1910 of the device 1900, or by hardware, or by a combination of software and hardware. A combination of the data processor 1910 and MEM 1920 may form processing means 1950 adapted to implement various embodiments of the present disclosure.

The MEM 1920 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the device 1900, there may be several physically distinct memory modules in the device 1900. The DP 1910 may be of any type suitable to the local technical environment, and may include one or more of general purpose computers, special purpose computers, microprocessors, digital signal processors (DSPs) and processors based on multicore processor architecture, as non-limiting examples. The device 1900 may have multiple processors, such as an application specific integrated circuit chip that is slaved in time to a clock which synchronizes the main processor.

A device (such as a terminal device or a network device, not shown) is provided in an embodiment, the device includes the device 1900, and the same contents as those in the first aspect and the second aspect of embodiments are omitted.

It will be appreciated that embodiments of the disclosure described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, radio transmitters, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general-purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine-readable medium may be a machine-readable signal medium or a machine-readable storage medium. The machine-readable medium may include but not limited to an electronic, magnetic, optical, electromagnetic, infrared, or semiconductor system, apparatus, or device, or any suitable combination of the foregoing.

More specific examples of the machine-readable storage medium would include an electrical connection having one or more wires, a portable computer diskette, a hard disk, a random-access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A radio frequency power amplifier, comprising a harmonic control circuit which comprises at least one edge-coupling resonator;
    wherein the edge-coupling resonator at least comprises a first microstrip line, a second microstrip line and a first transmission line; the second microstrip line and the first microstrip line are coupled and are in parallel along an axis over a length of the second microstrip; and
    one end of the second microstrip line that is in parallel with the first microstrip line along the axis is an open stub and not mechanically connected to any microstrip line or transmission line and another end of the second microstrip line is grounded via at least one hole to ground; and the first microstrip line having a first width is connected to the first transmission line having a second width which is wider than the first width.

2. The radio frequency power amplifier according to claim 1, wherein the harmonic control circuit is comprised in a conducting pattern; the radio frequency power amplifier further comprises:
    a planar dielectric substrate;
    a first conducting layer disposed on a first side of the planar dielectric substrate, and
    a second conducting layer disposed on a second side of the planar dielectric substrate;
    wherein the first conducting layer has the conducting pattern; the second conducting layer acts as a ground plane; and the second side of the planar dielectric substrate is opposite to the first side of the planar dielectric substrate.

3. The radio frequency power amplifier according to claim 1, wherein a first capacitance for harmonic suppression is formed by coupling the first microstrip line and the second microstrip line; and
    a first step impedance transformer for fundamental matching is formed by differencing widths of the first transmission line and the first microstrip line.

4. The radio frequency power amplifier according to claim 1, wherein a length of the first microstrip line is longer than or equal to a length of the second microstrip line.

5. The radio frequency power amplifier according to claim 1, wherein the edge-coupling resonator further comprises a third microstrip line and a fourth microstrip line; the fourth microstrip line and the third microstrip line are coupled and are in parallel along a first axis over a length of the fourth microstrip;

one end of the fourth microstrip line that is in parallel with the third microstrip along the first axis is an open stub and not mechanically connected to any microstrip line or transmission line and another end of the fourth microstrip line is grounded via at least one second hole to ground.

6. The radio frequency power amplifier according to claim 5, wherein a length of the third microstrip line is longer than or equal to a length of the fourth microstrip line.

7. The radio frequency power amplifier according to claim 5, wherein a second capacitance for harmonic suppression is formed by coupling the third microstrip line and the fourth microstrip line.

8. The radio frequency power amplifier according to claim 5, wherein the first microstrip line is connected to the third microstrip line having the first width via a second transmission line having the second width, the second transmission line at an opposite end of the first microstrip line than an end of the first microstrip line in which the first microstrip line is connected to the first transmission line;

a second step impedance transformer for fundamental matching is formed by differencing widths of the first microstrip line and the second transmission line; and
a third step impedance transformer for fundamental matching is formed by differencing widths of the second transmission line and the third microstrip line.

9. The radio frequency power amplifier according to claim 8, wherein the edge-coupling resonator is used for a direct current coupling.

10. The radio frequency power amplifier according to claim 8, wherein the second microstrip line is connected to the fourth microstrip line via a grounded terminal; the second microstrip line and the fourth microstrip line are configured in a U-shape; and the second transmission line is configured in a U-shape.

11. The radio frequency power amplifier according to claim 5, wherein one end of the first microstrip line is an open stub and one end of the third microstrip line is an open stub.

12. The radio frequency power amplifier according to claim 1, wherein at least two of the edge-coupling resonators are cascaded via at least one link microstrip line.

13. The radio frequency power amplifier according to claim 5, wherein the edge-coupling resonator further comprises a fifth microstrip line and/or a sixth microstrip line; the fifth microstrip line and the first microstrip line are coupled and are in parallel along a second axis over a length of the fifth microstrip line, the sixth microstrip line and the third microstrip line are coupled and are in parallel along a third axis over a length of the sixth microstrip line;

one end of the fifth microstrip line that is in parallel with the first microstrip along the second axis is an open stub and not mechanically connected to any microstrip or transmission line and another end of the fifth microstrip line is grounded via at least one third hole to ground; one end of the sixth microstrip line that is in parallel with the sixth microstrip along the third axis is an open stub and not mechanically connected to any microstrip or transmission line and another end of the sixth microstrip line is grounded via at least a fourth hole to ground.

14. The radio frequency power amplifier according to claim 13, wherein the fifth microstrip line is connected to the sixth microstrip line via a grounded terminal; and the fifth microstrip line and the sixth microstrip line are configured in a U-shape.

* * * * *